US012781411B2

(12) United States Patent
Choi et al.

(10) Patent No.: US 12,781,411 B2
(45) Date of Patent: Nov. 3, 2026

(54) TOUCH INPUT DEVICE AND LAUNDRY TREATING APPARATUS COMPRISING SAME

(71) Applicants: LG ELECTRONICS INC., Seoul (KR); AD SEMICON CO., LTD., Seoul (KR)

(72) Inventors: Daeho Choi, Seoul (KR); Cheol Lim, Seoul (KR)

(73) Assignees: LG ELECTRONICS INC., Seoul (KR); AD SEMICON CO., LTD., Seoul (KR)

( * ) Notice: Subject to any disclaimer, the term of this patent is extended or adjusted under 35 U.S.C. 154(b) by 312 days.

(21) Appl. No.: 18/701,506

(22) PCT Filed: Oct. 13, 2022

(86) PCT No.: PCT/KR2022/015515

§ 371 (c)(1),
(2) Date: Apr. 15, 2024

(87) PCT Pub. No.: WO2023/063750

PCT Pub. Date: Apr. 20, 2023

(65) Prior Publication Data

US 2024/0417907 A1 Dec. 19, 2024

(30) Foreign Application Priority Data

Oct. 15, 2021 (KR) ........................ 10-2021-0137458
Dec. 29, 2021 (KR) ........................ 10-2021-0190735

(51) Int. Cl.
*D06F 34/30* (2020.01)
*D06F 34/32* (2020.01)
*H03K 17/96* (2006.01)

(52) U.S. Cl.
CPC .............. *D06F 34/30* (2020.02); *D06F 34/32* (2020.02); *H03K 17/962* (2013.01); *H03K 2217/96015* (2013.01)

(58) Field of Classification Search
CPC ....... D06F 34/30; D06F 34/32; H03K 17/962; H03K 2217/96015; H03K 17/9622;
(Continued)

(56) References Cited

U.S. PATENT DOCUMENTS 7,579,569 B2 * 8/2009 Romanowski ............ F16F 1/08 200/600
7,741,858 B2 * 6/2010 Jeong ................... H03K 17/962 200/600
(Continued)

FOREIGN PATENT DOCUMENTS

CN 209844935 U 12/2019
KR 10-1225973 B1 1/2013
(Continued)

*Primary Examiner* — Lheiren Mae A Caroc
(74) *Attorney, Agent, or Firm* — Birch, Stewart, Kolasch & Birch, LLP

(57) ABSTRACT

A touch input device includes a printed circuit board, a second substrate receiving a touch input from a user, and a spring member mounted on the surface of the printed circuit board and arranged to be in contact with the second substrate. The spring member includes a middle portion formed by a spring having a first diameter; a first end portion which extends from one side of the middle portion and the diameter of which expands to be larger than the first diameter; and a second end portion which extends from the other side of the middle portion and the diameter of which expands to be larger than the first diameter.

20 Claims, 8 Drawing Sheets

(58) Field of Classification Search
CPC ........ H03K 2217/96076; H03K 2217/960755; H03K 17/96; G06F 3/041
USPC .......................................................... 200/600
See application file for complete search history.

(56) References Cited

U.S. PATENT DOCUMENTS

| | | | | |
|---|---|---|---|---|
| 11,495,421 | B2 * | 11/2022 | Huang | H01H 13/84 |
| 2008/0099322 | A1 | 5/2008 | Romanowski | |
| 2020/0294737 | A1 | 9/2020 | Huang et al. | |
| 2025/0202485 | A1 * | 6/2025 | Zhang | H03K 17/962 |

FOREIGN PATENT DOCUMENTS

| | | | |
|---|---|---|---|
| KR | 10-1239013 | B1 | 3/2013 |
| KR | 10-1370376 | B1 | 3/2014 |
| KR | 10-2016-0076555 | A | 7/2016 |

* cited by examiner

TOUCH INPUT DEVICE AND LAUNDRY TREATING APPARATUS COMPRISING SAME

CROSS-REFERENCE TO RELATED APPLICATIONS

This application is the National Phase of PCT International Application No. PCT/KR2022/015515, filed on Oct. 13, 2022, which claims priority under 35 U.S.C. 119(a) to Patent Application No. 10-2021-0137458, filed in the Republic of Korea on Oct. 15, 2021, and Patent Application No. 10-2021-0190735, filed in the Republic of Korea on Dec. 29, 2021, all of which are hereby expressly incorporated by reference into the present application.

TECHNICAL FIELD

The disclosure relates to a circuit board as a touch input device, a laundry treating apparatus including the same, and a method of manufacturing the circuit board.

BACKGROUND ART

In general, a laundry treating apparatus, which is an apparatus that performs various operations related to laundry (washing, drying, deodorizing, wrinkle removal, and so on), conceptually covers a washing device for washing laundry, a drying device for drying wet laundry, and a refresher for removing odors or wrinkles from laundry.

The laundry treating apparatus is provided with a circuit board as a touch input device to allow a user to operate the apparatus.

As a touch input device, the circuit board may be a capacitive touch input device that senses a change in capacitance caused by physical contact of the user. The capacitive touch input device has a lower frequency than usual when there is physical contact, and a touch sensor integrated circuit (IC) detects this and determines whether it has been touched.

In general, the capacitive touch input device includes a second substrate (e.g., glass or a film) on which a human body is touched, a touch rod electrically connected to the second substrate, and a printed circuit board on which the touch rod is installed. Conventionally, an elastic member made of a material such as urethane foam or silicone is disposed between the second substrate and the touch rod to provide a feeling of pressing when a human body touches the second substrate, and electrically connected to the second substrate by a conductive covering provided on the elastic member. However, the conductive covering is corroded in a high-temperature, high-humidity installation environment.

To overcome the problem, a spring is placed between the second substrate and the touch rod. In this case, however, the distance between the second substrate and the printed circuit board is increased, and thus the touch input device occupies a lot of space.

Moreover, in the process of combining the touch rod and the spring with the printed circuit board, the conventional spring structure has a problem that suction air escapes through the gap of the spring, which requires a manual operation and thus increases cost.

In addition, a hole is drilled in the printed circuit board to combine the touch rod with the printed circuit board. In view of the drilling of the hole, the bottom surface of the printed circuit board should be designed to avoid the hole, and the resulting design restrictions limit design freedom in the limited size of the printed circuit board.

DISCLOSURE

Technical Problem

An object of the disclosure is to provide a touch input device with a high degree of circuit design freedom.

An object of the disclosure is to provide a slim touch input device by reducing the distance between a substrate forming a second substrate surface and a printed circuit board.

An object of the disclosure is to provide a method of manufacturing a touch input device, which may improve a tact time and a process defect rate.

An object of the disclosure is to provide a touch input device which may prevent the occurrence of touch insensitivity caused by corrosion.

It will be appreciated by persons skilled in the art that the objects that could be achieved with the disclosure are not limited to what has been described above, and the other unmentioned objects will be clearly understood from the following detailed description.

Technical Solution

The disclosure provides a touch input device. In an embodiment, the touch input device includes a first substrate, a second substrate receiving a touch input of a user, and a spring member mounted on a surface of the first substrate and prepared in contact with the second substrate. The spring member includes a middle portion including a spring having a first diameter, and a first end portion extending from one side of the middle portion and expanding to a diameter larger than the first diameter.

According to an embodiment, the spring member may further include a second end portion extending from the other side of the middle portion, and expanding to a diameter larger than the first diameter.

According to an embodiment, a cap covering the second end portion may be provided on a side where the second end portion is provided, and a top portion of the cap may contact the second substrate.

According to an embodiment, the top portion may be provided flat.

According to an embodiment, the cap may further include a side portion extending downward from a perimeter of the top portion.

According to an embodiment, the side portion may include a plurality of bent portions bent in an inward direction, and the cap may be coupled to the second end portion by the bent portions.

According to an embodiment, an inner diameter formed by the plurality of bent portions may be smaller than the diameter to which the second end portion expands.

According to an embodiment, the first substrate and the first end portion may be mounted by soldering.

According to an embodiment, at least one of the first end portion or the second end portion may include a first portion having a wire of a small diameter.

According to an embodiment, the at least one of the first end portion or the second end portion may further include a second portion extending from the first portion and having a wire of a larger diameter than the wire of the first portion.

Further, the disclosure provides a laundry treating apparatus. In an embodiment, the laundry treating apparatus includes a cabinet, and a control panel coupled to the cabinet and inputting an operation command. The control panel includes the above-described touch input device.

Further, the disclosure provides a method of manufacturing a touch input device. In an embodiment, the method includes preparing a first substrate, preparing a spring member in which a cap with a flat top surface is coupled to a top of a spring, picking up the spring member by air suction of the top surface of the cap, and mounting the spring member on a surface of the first substrate.

According to an embodiment, the spring member may be positioned at a set position on the first substrate by the air suction.

According to an embodiment, the spring may include a middle portion including a spring having a first diameter, and a first end portion extending from one side of the middle portion and expanding to a diameter larger than the first diameter. The first substrate and the first end portion may be mounted by soldering.

According to an embodiment, the spring may further include a second end portion extending from the other side of the middle portion and expanding to a diameter larger than the first diameter, and the cap may be prepared to cover the second end portion of the spring by the top portion thereof.

According to an embodiment, the cap may further include a side portion extending downward from a perimeter of the top portion, and a plurality of bent portions bent in an inward direction may be formed on the side portion and couple the cap to the second end portion.

According to an embodiment, an inner diameter formed by the plurality of bent portions may be smaller than the diameter to which the second end portion expands.

According to an embodiment, the method may further include positioning the second substrate on the top portion of the cap.

Advantageous Effects

According to an embodiment of the disclosure, the degree of circuit design freedom of a touch input device may be increased.

According to an embodiment of the disclosure, the distance between a substrate forming a surface of a touch input device and a printed circuit board may be reduced.

According to an embodiment of the disclosure, a tact time and a process defect rate may be improved in a process of manufacturing a touch input device.

According to an embodiment of the disclosure, the occurrence of touch insensitivity caused by corrosion may be prevented.

It will be appreciated by persons skilled in the art that the effects of the disclosure are not limited to what has been described above and other unmentioned advantages will be clearly understood from the specification and the accompanying drawings.

BEST MODE

Figure 1:
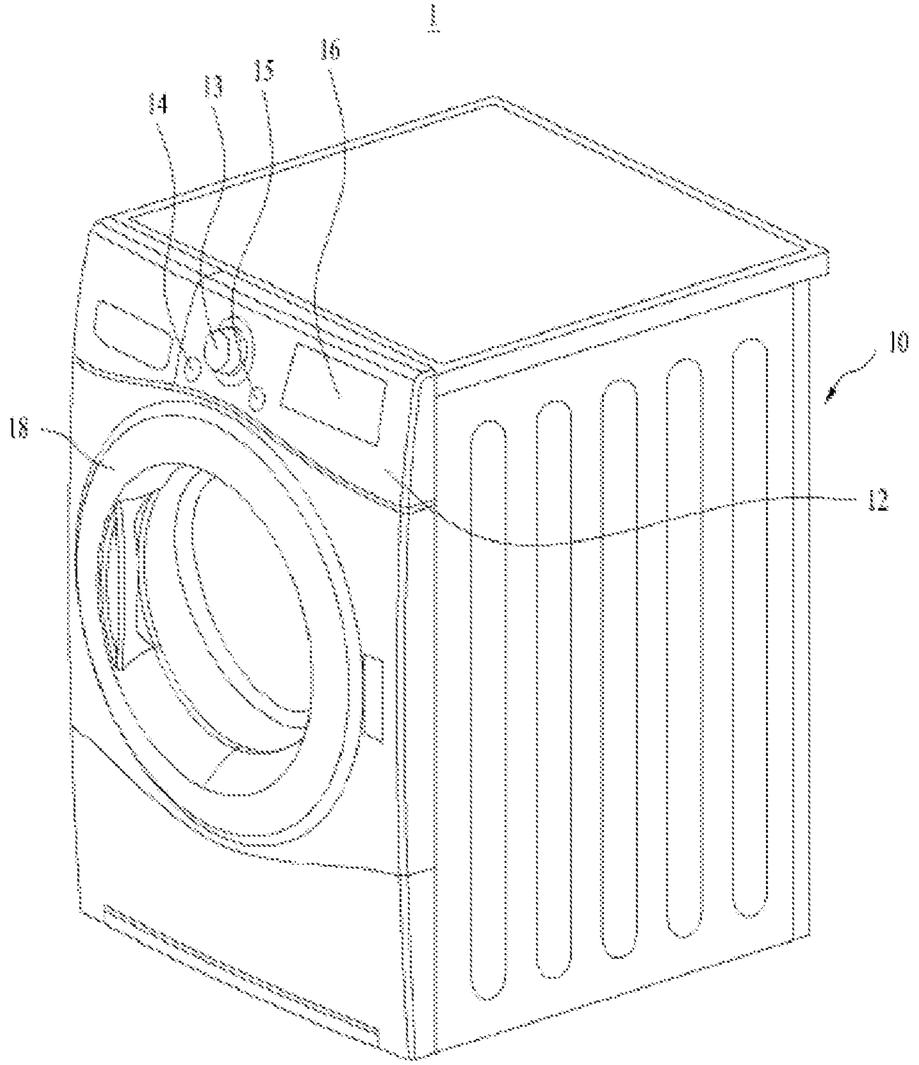
FIG. 1 is a perspective view illustrating a washing machine according to an embodiment of the disclosure.

A preferred embodiment of the disclosure will now be described in detail with reference to the accompanying drawings. The configuration of a device or a control method described herein is for the purpose of illustrating an embodiment of the disclosure, not intended to limit the scope of the disclosure, and like reference numerals used throughout the specification denote the same components.

Certain terms used herein are given for convenience of description only and are not intended to limit the embodiment shown.

For example, expressions such as 'same' and 'identical to' refer not only to strictly identical, but also to tolerances or differences in the degree to which the same function is achieved.

In this specification, when a component is referred to as being 'connected' or 'coupled' to another component, it is to be understood that the component may be directly connected or coupled to the other component, but that there may be a third component in between. On the other hand, when a component is referred to herein as being 'directly connected' or 'directly coupled' to another component, it is to be understood that there are no other components in between.

As used herein, the term 'including' or 'having' is intended to specify the presence of a feature, a number, a step, an operation, a component, a part, or a combination thereof, not intended to exclude the presence or addition of one or more other features, numbers, steps, operations, components, parts, or combinations thereof.

For example, expressions referring to a relative or absolute arrangement, such as 'in a direction,' 'along a direction,' 'side by side,' 'perpendicular,' 'centered,' 'concentric,' or 'coaxial,' are intended not only to refer strictly to such arrangement, but also to a tolerance, or to a state of relative displacement by an angle or distance such that the same function is obtained.

To describe the disclosure, the following description is based on a spatial Cartesian coordinate system with the X axis, Y axis, and Z axis perpendicular to each other. Each axial direction (X-axis, Y-axis, and Z-axis directions) refers to both directions in which each axis extends. A '+' sign (+X, +Y, and +Z) following each axis direction means a positive direction which is one of the two directions in which each axis extends. A '−' sign (−X, −Y, and −Z) following each axis direction means a negative direction which is the other of the two directions in which each axis extends.

References herein to directions such as 'forward (+Y), backward (−Y), left (+X), right (−X), up (+Z), and down (−Z)' are defined along the XYZ coordinate axes, but only for the purpose of clarity of the disclosure, and it is possible to define these directions differently depending on where a reference is placed.

The use of terms such as 'first, second, third,' and so on before components described herein is intended to avoid confusion as to which components are referred to and is not intended to indicate any order, importance, or master-servant relationship among the components. For example, an invention may be implemented, which includes only a second component without a first component.

As used herein, a singular form includes plural referents, unless the context clearly indicates otherwise.

As used herein, the term 'and/or' includes any combination of a plurality of recited items or any of the plurality of recited items. As used herein, 'A or B' may include 'A', 'B', or 'both A and B'.

FIG. 1 is a perspective view illustrating a washing machine according to an embodiment of the disclosure. The perspective view of FIG. 1 illustrates the exterior of a washing machine according to an embodiment of the disclosure. A description will be given with reference to FIG. 1.

A laundry treating apparatus 1 of the disclosure may include a cabinet 10 forming the exterior thereof, a control panel 12 coupled to the cabinet 10 to input an operation command or display a state, and a door 18 rotatably coupled to a front of the cabinet 10 to open and close an opening through which clothes are put in.

The control panel 12 may be coupled to the top of the cabinet 10. The control panel 12 may have a controller including a microcomputer that controls the laundry treating apparatus 1. The control panel 12 may include a display 16 displaying a state of the laundry treating apparatus 1, and an input unit inputting a command to the controller.

The display 16 may include a touch input device 1000 receiving a command. The touch input device 1000 includes a circuit board. As the display 16 includes the touch input device 1000, the display 16 may function as an input unit. The display 16 may be provided to accurately transmit information about the laundry treating apparatus 1 to a user by displaying an operating state or abnormal state of the laundry treating apparatus 1 to the outside. The display 16 may further include a speaker to emit an alarm sound to the user.

The input unit may be provided as a rotary knob 13 to select any drying course or option of the laundry treating apparatus. Further, the input unit may include a power input unit 14 inputting power to the laundry treating apparatus 1 and a command input unit 15 inputting a separate control command.

The power input unit 14 and the command input unit 15 may be provided as physical buttons so that a command may be transmitted to the display 16 even if power is not supplied to the display 16.

The door 18 may be rotatably provided on the front of the cabinet 10. The door 18 may be made of a transparent material to allow viewing through the opening provided in the cabinet 10. The door 18 may include a handle on one side thereof and coupled to a hinge on the other side thereof, to open and close the opening of the cabinet 10. While FIG. 1 illustrates a front load-type laundry treating apparatus 1 with the door 18 provided at the front thereof, this does not exclude a top load-type laundry treating apparatus with the door 18 provided on the top thereof.

Figure 2:
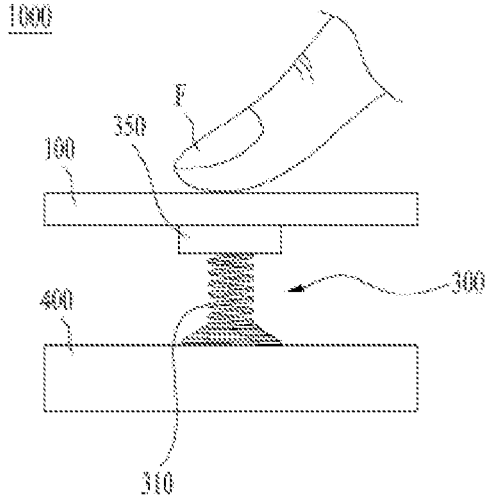
FIG. 2 is a schematic diagram illustrating a touch input device according to an embodiment of the disclosure.

FIG. 2 is a schematic diagram illustrating the touch input device 1000 according to an embodiment of the disclosure. The touch input device 1000 may be provided as the display 16 according to an embodiment of the disclosure. This will be described with reference to FIG. 2.

The touch input device 1000 includes a touch board 100 receiving a touch input from the user, a printed circuit board 400, and a spring member 300 mounted on the printed circuit board 400.

The spring member 300 is installed to contact an inner side of the touch board 100 and elastically deformed by pressing of the touch board 100. The spring member 300 is installed on the printed circuit board 400. A capacitive sensor is installed on the printed circuit board 400, and when a human body F contacts the touch board 100, an electrical signal is transmitted to the capacitive sensor through the spring member 300, thus performing switching.

Figure 3:
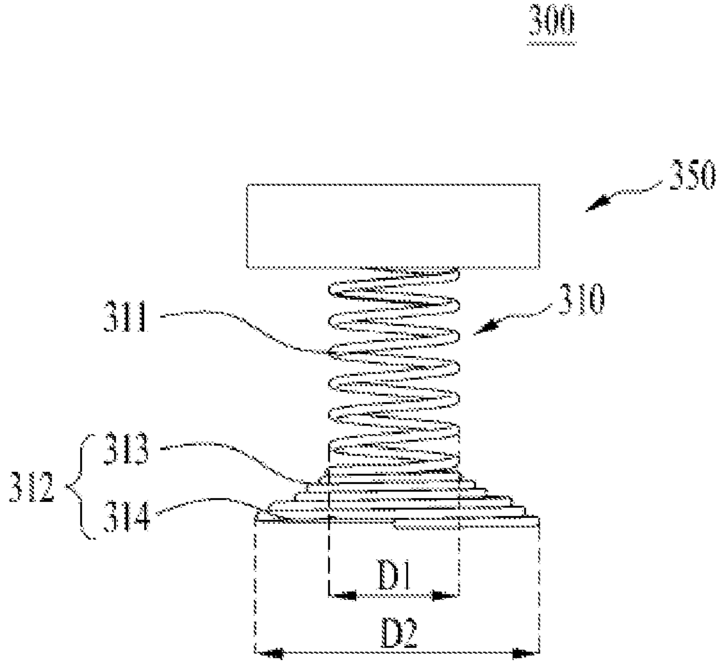
FIG. 3 is a side view illustrating a spring member according to an embodiment of the disclosure applied to a touch input device according to an embodiment of the disclosure.
Figure 4:
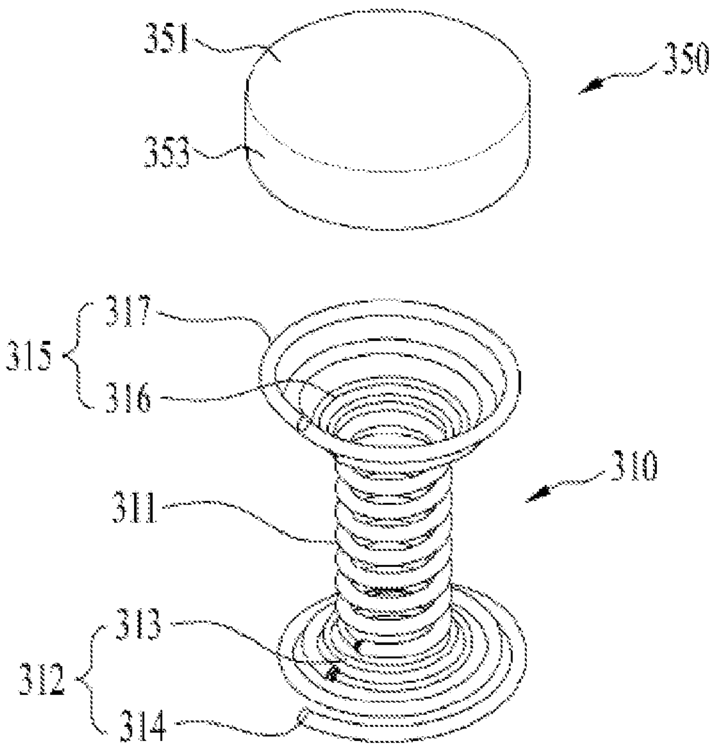
FIG. 4 is an exploded perspective view illustrating a spring member according to an embodiment of the disclosure.

FIG. 3 is a side view illustrating a spring member according to an embodiment of the disclosure applied to a touch input device according to an embodiment of the disclosure. FIG. 4 is an exploded perspective view illustrating a spring member according to an embodiment of the disclosure. The spring member 300 will be described with reference to FIGS. 3 and 4.

The spring member 300 includes a spring 310 and a cap 350.

The spring 310 includes a middle portion 311, a first end portion 312, and a second end portion 315. The spring 310 is provided as an electrical conductor. In an embodiment, the spring 310 may be provided by plating stainless steel with nickel. The spring 310 may be provided by machining a stainless steel wire plated with nickel into a spring shape.

The middle portion 311 is formed as a compressed coil spring of a specific length. The middle portion 311 has a first diameter D1. The length of the middle portion 311 may be defined as a length corresponding to a separation distance between the touch board 100 and the printed circuit board 400.

The first end portion 312 extends from the bottom of the middle portion 311. The first end portion 312 gradually expands from the first diameter D1 to a second diameter D2. The second diameter D2 is larger than the first diameter D1. The first end portion 312 may include a first portion 313 and a second portion 314. The first portion 313 extends from one end of the middle portion 311. The second portion 314 extends from a distal end of the first portion 313. The diameter of a wire forming the first portion 313 may be smaller than the diameter of a wire forming the middle portion 311. The diameter of the wire forming the first portion 313 may be smaller than the diameter of a wire forming the second portion 314. The first portion 313 may facilitate expansion of the first end portion 312 to the second diameter D2.

The first end portion 312 is bonded to the printed circuit board 400. The first end portion 312 is mounted on the printed circuit board 400 by soldering. The first end portion 312 is mounted to a surface of the printed circuit board 400.

The second end portion 315 extends from the top of the middle portion 311. The second end portion 315 gradually expands from the first diameter D1 to the second diameter D2. The second diameter D2 is larger than the first diameter D1. The second end portion 315 may include a first portion 316 and a second portion 317. The first portion 316 extends from the other end of the middle portion 311. The second portion 317 extends from a distal end of the first portion 316. The diameter of a wire forming the first portion 316 may be smaller than the diameter of the wire forming the middle portion 311. The diameter of the wire forming the first portion 316 may be smaller than the diameter of a wire forming the second portion 317. The first portion 316 may facilitate expansion of the second end portion 315 to the second diameter D2.

The cap 350 is coupled to a top end of the spring 310. The cap 350 is coupled to the second end portion 315 of the spring 310. The cap 350 includes a top portion 351 and a side portion 353. The top portion 351 may be formed to be circular. The shape of the top portion 351 only needs to be sufficient to cover the second end portion 315. The side portion 353 extends downward from the perimeter of the top portion 351. The side portion 353 surrounds the second end portion 315. The cap 350 is provided as an electrical conductor. In an embodiment, the cap 350 is made of a stainless steel material.

Figure 5:
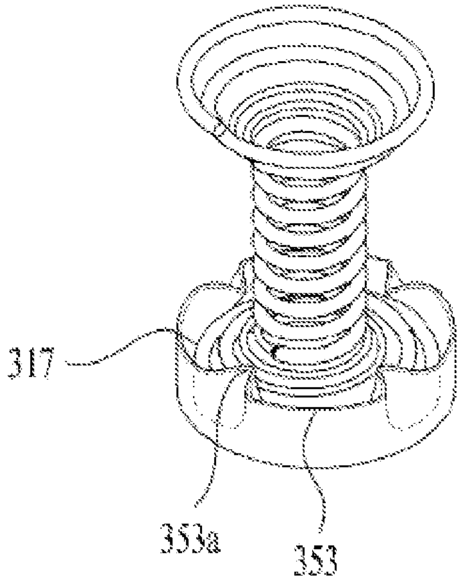
FIG. 5 is a perspective view illustrating a spring member according to an embodiment of the disclosure, viewed from a bottom surface thereof.
Figure 6:
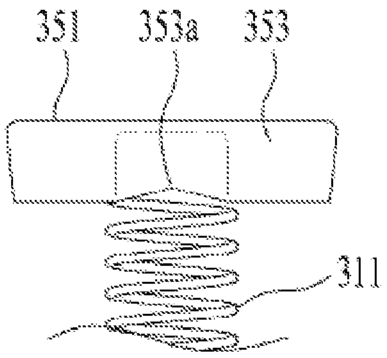
FIG. 6 is an enlarged side view illustrating a coupling portion between a cap and a spring in a spring member according to an embodiment of the disclosure.

FIG. 5 is a perspective view illustrating a spring member according to an embodiment of the disclosure, viewed from a bottom surface thereof. FIG. 6 is an enlarged side view illustrating a coupling portion between a cap and a spring in a spring member according to an embodiment of the disclosure. A description will be given with further reference to FIGS. 5 and 6. The side portion 353 includes a bent portion 353*a*. The bent portion 353*a* is formed on the bottom of the side portion 353. The bent portion 353*a* is obtained by bending a bottom end of the side portion 353 in an inward direction. Bent portions 353*a* may be formed at a plurality of positions, to be more inward in a downward direction. The bent portions 353*a* may be formed at four positions spaced apart from each other by 90 degrees. An inner diameter formed by the plurality of bent portions 353*a* is smaller than the second diameter D2. As the bent portions 353*a* are formed, the cap 350 is coupled to the spring 310.

The top portion 351 of the cap 350 is provided flat. The top portion 351 of the cap 350 is provided in contact with the touch board 100. For example, the top portion 351 of the cap 350 surface-contacts the touch board 100. As used in the disclosure, the expression contact is a concept covering a tolerance. Further, even if the top portion 351 of the cap 350 is spaced apart from the touch board 100 by a predetermined distance, the expression contact conceptually covers bringing the top portion 351 of the cap 350 into contact with the touch board 100 by pressing the touch board 100 with the user's body F.

Figure 7:
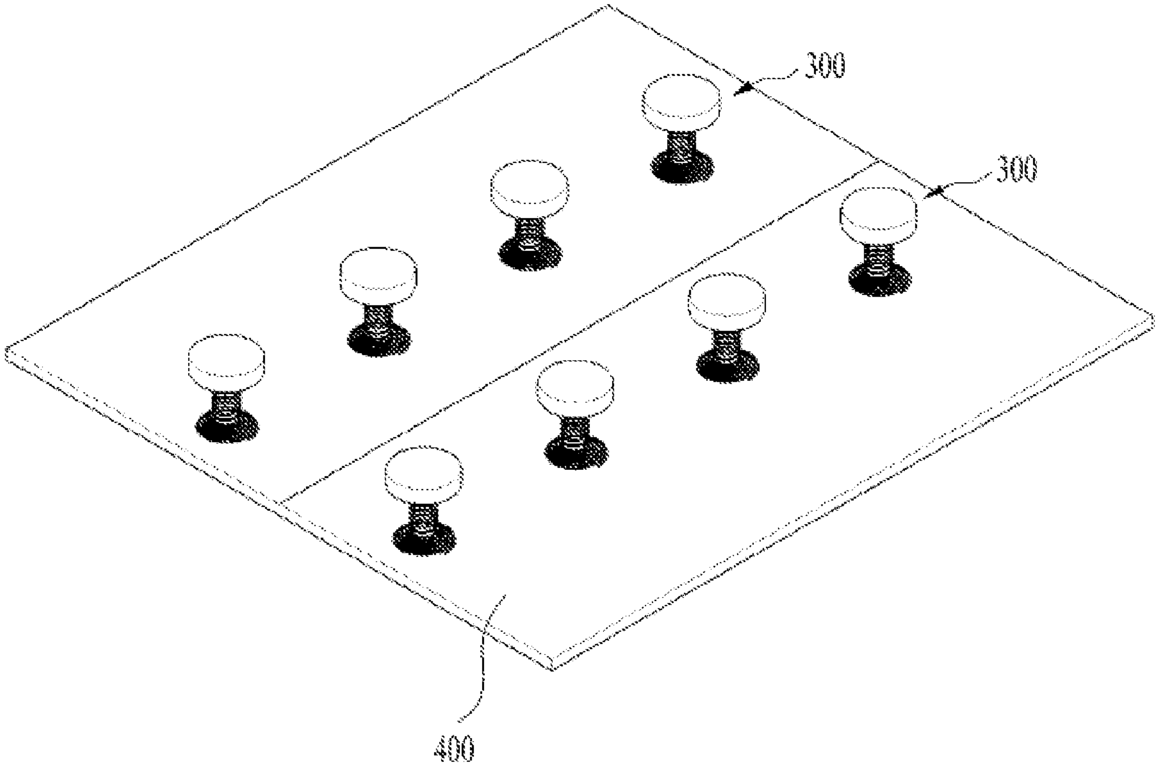
FIG. 7 is a perspective view illustrating a spring member according to an embodiment of the disclosure, attached to a printed circuit board.

FIG. 7 is a diagram illustrating a spring member attached to a printed circuit board according to an embodiment of the disclosure. With reference to FIG. 7, a description will be given. The spring member 300 is mounted on a surface of the printed circuit board 400. The printed circuit board 400 on which the spring member 300 is mounted does not require formation of a separate hole or structure to fix the spring member 300. Therefore, according to an embodiment of the disclosure, the circuit design freedom of the printed circuit board 400 is high.

Figure 8:
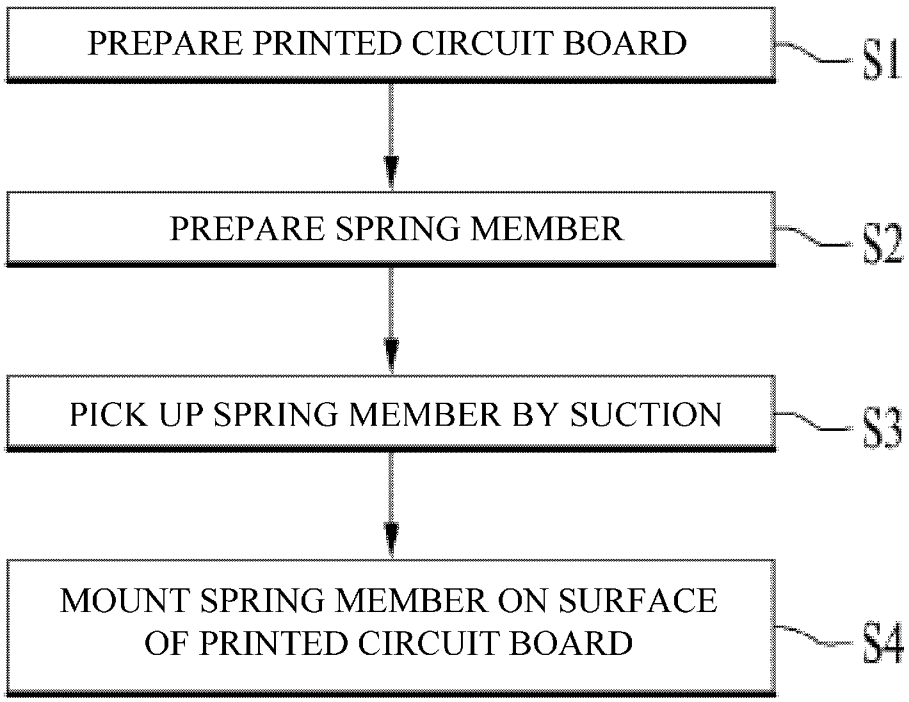
FIG. 8 is a flowchart illustrating a method of manufacturing a touch input device according to an embodiment of the disclosure.

FIG. 8 is a flowchart illustrating a method of manufacturing a touch input device according to an embodiment of the disclosure. A description will be given with reference to FIG. 8.

The printed circuit board 400 is prepared (S1). The printed circuit board 400 is provided with a designed circuit printed thereon. A position at which the spring member 300 is installed is defined on the printed circuit board 400.

The spring member 300 is prepared (S2). The spring member 300 is prepared with the spring 310 and the cap 350 coupled to each other.

The prepared spring member 300 is picked up by suction of an automatic mounting machine (S3). The spring member 300 is picked up by the automatic mounting machine. The automatic mounting machine is well-known in the art and will not be described herein. The suction, which refers to picking up an object by sucking air, may pick up the flat top surface of the cap 350. The spring member 300 may be picked up by sucking the cap 350.

The automatic mounting machine mounts the spring member 300 on the surface of the printed circuit board 400 (S4). Since the spring member 300 is surface-mounted on the printed circuit board 400 by the automatic mounting machine, a tact time and a process defect rate may be improved, compared to a conventional method.

According to the touch input device 1000 according to an embodiment of the disclosure, the distance between the touch board 100 and the printed circuit board 400 may be reduced. Therefore, the touch input device 1000 may become slim, compared to a conventional touch input device. Applying the touch input device 1000 according to an embodiment of the disclosure to the laundry treating apparatus 1 has the effect of increasing the design space of the laundry treating apparatus 1, since as much space as the slim-down of the touch input device 1000 may be secured in the touch input device 1000. Furthermore, according to an embodiment of the disclosure, the spring member 300 may prevent the phenomenon of touch insensitivity caused by corrosion.

While the disclosure has been illustrated and described with reference to a specific embodiment, it will be apparent to those skilled in the art that various modifications and variations may be made to the disclosure without departing from the scope and spirit of the disclosure as provided by the appended claims.

The invention claimed is:

1. A touch input device comprising:
- a first substrate;
- a second substrate; and
- a spring member mounted on a surface of the first substrate, the spring member being configured to contact the second substrate, the spring member including a spring having:
  - a middle portion having a first diameter; and
  - a first end portion extending from a first end of the middle portion, the first end portion expanding to a diameter larger than the first diameter of the middle portion,
- wherein the first end portion includes a first portion having a wire diameter that is smaller than a wire diameter of a remaining portion of the spring.

2. The touch input device of claim 1, wherein the spring further includes a second end portion extending from a second end of the middle portion, the second end portion expanding to a diameter larger than the first diameter of the middle portion.

3. The touch input device of claim 2, further comprising a cap covering the second end portion, the cap being located between the second end portion and the second substrate such that a top portion of the cap is configured to contact the second substrate.

4. The touch input device of claim 3, wherein the top portion is flat.

5. The touch input device of claim 3, wherein the cap further includes a side portion extending from a perimeter of the top portion.

6. The touch input device of claim 5, wherein the side portion includes a plurality of bent portions extending in an inward direction, and
- wherein the cap is coupled to the second end portion by the bent portions.

7. The touch input device of claim 6, wherein the plurality of bent portions define an inner diameter that is smaller than the diameter to which the second end portion expands.

8. The touch input device of claim 2, wherein the second end portion includes a first portion having a wire diameter that is smaller than the wire diameter of the remaining portion of the spring.

9. The touch input device of claim 8, wherein at least one of the first end portion or the second end portion further includes a second portion extending from the first portion, the second portion having a wire diameter that is larger than the wire diameter of the first portion.

10. The touch input device of claim 1, wherein the first substrate and the first end portion are connected by soldering.

11. The touch input device of claim 1, wherein the first substrate is a printed circuit board.

12. The touch input device of claim 1, wherein the second substrate defines a surface of the touch input device configured to be physically contacted by a user.

13. A laundry treating apparatus comprising:

a cabinet; and a control panel coupled to the cabinet, the control panel being configured to input an operation command of the laundry treating apparatus, the control panel including the touch input device of claim 1.

14. A method of manufacturing a touch input device, the method comprising:

preparing a first substrate;

preparing a spring member having a spring and a cap, the cap including a top portion having a flat surface, the cap being coupled to a top of the spring;

picking up the spring member by air suction applied to the top portion of the cap; and mounting the spring member on a surface of the first substrate, wherein the spring includes:

a middle portion having a first diameter; and a first end portion extending from a first end of the middle portion, the first end portion expanding to a diameter larger than the first diameter of the middle portion, and wherein the first end portion includes a first portion having a wire diameter that is smaller than a wire diameter of a remaining portion of the spring.

15. The method of claim 14, wherein the spring member is positioned at a predetermined position on the first substrate by the air suction.

16. The method of claim 14, wherein the mounting the spring member includes soldering the first substrate and the first end portion.

17. The method of claim 16, wherein the spring further includes a second end portion extending from a second end of the middle portion, the second end portion expanding to a diameter larger than the first diameter of the middle portion, and wherein the cap is coupled to the second end portion of the spring.

18. The method of claim 17, wherein the cap further includes a side portion extending from a perimeter of the top portion, and wherein the side portion includes a plurality of bent portions extending in an inward direction to couple the cap to the second end portion.

19. The method of claim 18, wherein the plurality of bent portions defines an inner diameter that is smaller than the diameter to which the second end portion expands.

20. The method of claim 16, further comprising positioning a second substrate on the top portion of the cap.

* * * * *